United States Patent
Kang et al.

(10) Patent No.: US 10,553,644 B2
(45) Date of Patent: Feb. 4, 2020

(54) TEST CIRCUIT BLOCK, VARIABLE RESISTANCE MEMORY DEVICE INCLUDING THE SAME, AND METHOD OF FORMING THE VARIABLE RESISTANCE MEMORY DEVICE

(71) Applicant: SK hynix Inc., Icheon-si, Gyeonggi-do (KR)

(72) Inventors: Seok Joon Kang, Seoul (KR); Ho Seok Em, Hwaseong (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/016,148

(22) Filed: Jun. 22, 2018

(65) Prior Publication Data
US 2019/0157347 A1    May 23, 2019

(30) Foreign Application Priority Data
Nov. 20, 2017  (KR) .................. 10-2017-0155058

(51) Int. Cl.
| H01L 27/24 | (2006.01) |
| G11C 29/12 | (2006.01) |
| G11C 13/00 | (2006.01) |
| H01L 45/00 | (2006.01) |
| H01L 21/66 | (2006.01) |
| G11C 29/02 | (2006.01) |
| G11C 29/24 | (2006.01) |
| G11C 29/04 | (2006.01) |
| G11C 5/02 | (2006.01) |

(52) U.S. Cl.
CPC ........ *H01L 27/2463* (2013.01); *G11C 13/004* (2013.01); *G11C 13/0004* (2013.01); *G11C 29/026* (2013.01); *G11C 29/12005* (2013.01); *G11C 29/24* (2013.01); *H01L 22/20* (2013.01); *H01L 45/06* (2013.01); *H01L 45/16* (2013.01); *G11C 5/025* (2013.01); *G11C 2029/0403* (2013.01); *G11C 2029/1202* (2013.01); *G11C 2029/1204* (2013.01); *G11C 2029/1206* (2013.01); *G11C 2213/15* (2013.01); *H01L 27/2427* (2013.01)

(58) Field of Classification Search
USPC ........................................... 365/163
See application file for complete search history.

(56) References Cited

U.S. PATENT DOCUMENTS

| 9,607,713 | B1 | 3/2017 | Em |
| 10,290,327 | B2* | 5/2019 | Luo ................... G11C 5/06 |
| 2016/0180933 | A1 | 6/2016 | Vincenzo et al. |

* cited by examiner

*Primary Examiner* — James G Norman
(74) *Attorney, Agent, or Firm* — William Park & Associates Ltd.

(57) ABSTRACT

A test circuit block may include a first signal line, a second signal line, a high resistive path unit, and a low resistive path unit. The high resistive path unit may be connected between the first signal line and the second signal line. The low resistive path unit may have a resistance lower than that of the high resistive path unit. The low resistive path unit may be selectively connected in parallel with the high resistive path unit between the first signal line and the second signal line.

19 Claims, 7 Drawing Sheets

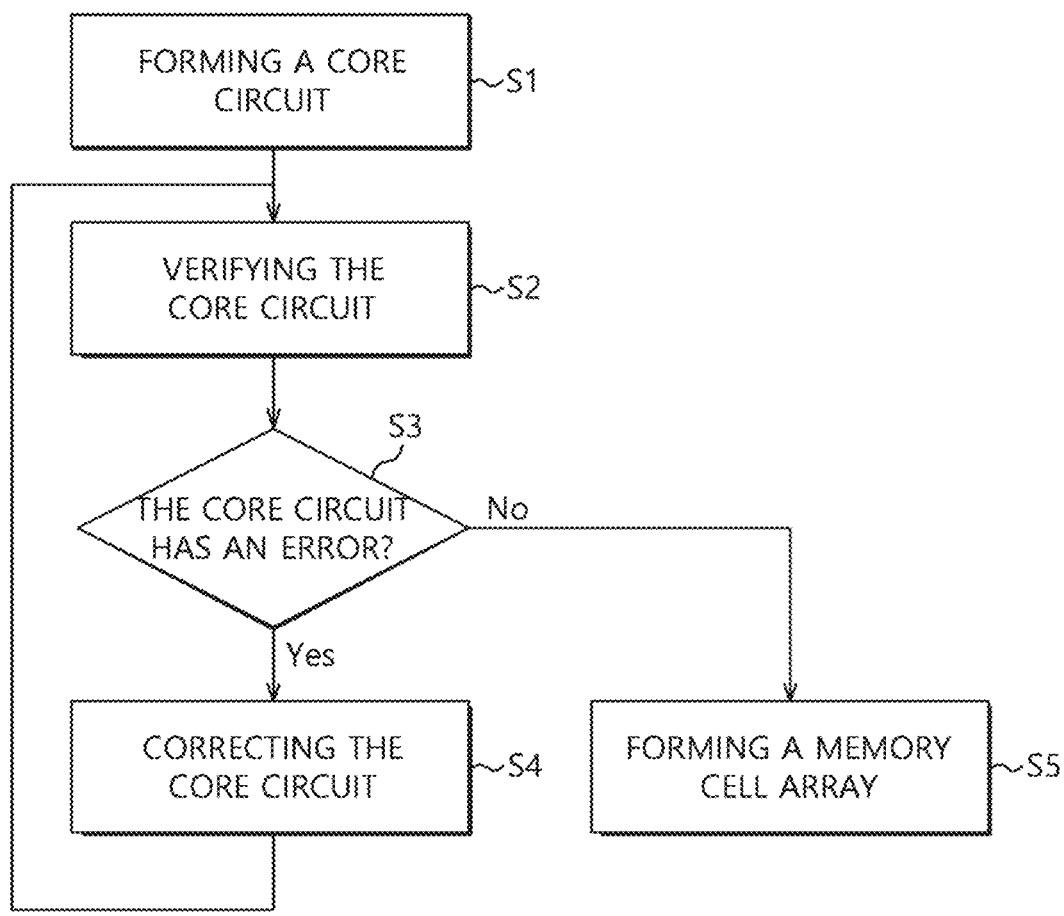

TEST CIRCUIT BLOCK, VARIABLE RESISTANCE MEMORY DEVICE INCLUDING THE SAME, AND METHOD OF FORMING THE VARIABLE RESISTANCE MEMORY DEVICE

CROSS-REFERENCES TO RELATED APPLICATION

The present application claims priority under 35 U.S.C. § 119(a) to Korean application number 10-2017-0155058, filed on Nov. 20, 2017, in the Korean Intellectual Property Office, which is incorporated herein by reference in its entirety.

BACKGROUND

1. Technical Field

Various embodiments generally relate to a non-volatile memory device, more particularly a test circuit block relating to core verification, a variable resistance memory device including the test circuit block, and a method of forming the variable resistance memory device.

2. Related Art

In order to provide high capacity with low power consumption for a memory device, next generation memory devices are being studied. These next generation memory devices being studied generally have non-volatile characteristics without refreshing.

The next generation of the memory devices may have a high integration of dynamic random access memory (DRAM), non-volatile characteristics of a flash memory, and still have the rapid speed of a static RAM (SRAM).

The next generation of the memory devices may include a phase changeable RAM (PCRAM), a nano floating gate memory (NFGM), a polymer RAM (PoRAM), a magnetic RAM (MRAM), a ferroelectric RAM (FeRAM), a resistive RAM (ReRAM), etc.

The next generation of the memory devices may include a core circuit block having a control circuit block and a memory cell array.

SUMMARY

In an embodiment, a test circuit block may include a first signal line, a second signal line, a high resistive path unit, and a low resistive path unit. The high resistive path unit may be connected between the first signal line and the second signal line. The low resistive path unit may have a resistance lower than that of the high resistive path unit. The low resistive path unit may be selectively connected in parallel with the high resistive path unit between the first signal line and the second signal line.

In an embodiment, a variable resistance memory device may include a semiconductor substrate, a core circuit block and a memory cell array. The core circuit block may include a sense amplifier arranged on the semiconductor substrate, and a test circuit block. The memory cell array may be arranged over the core circuit block. The memory cell array may include a plurality of bit lines, a plurality of word lines and resistive memory cells connected between the bit lines and the word lines. The test circuit block may include may include a test bit line, a test word line, a high resistive path unit, and a low resistive path unit. The test bit line may be connected with any one of the bit lines. The test word line may be connected with any one of the word lines. The high resistive path unit may be connected between the any one of the bit lines and the any one of the word lines when a test mode signal is enabled. The low resistive path unit may be selectively connected in parallel with the high resistive path unit between the test bit line and the test word line.

In an embodiment, in a method of forming a variable resistance memory device, a core circuit may be formed on a semiconductor substrate. The core circuit may include a test circuit block formed by modeling a memory cell. The core circuit may be verified using the test circuit block. The core circuit may be corrected when an error may be generated in the core circuit. A memory cell array including a plurality of the memory cells may be formed on the core circuit.

BRIEF DESCRIPTION OF THE DRAWINGS

FIG. 9 is a flow chart illustrating a method of forming a variable resistance memory device in accordance with examples of embodiments.

DETAILED DESCRIPTION

Hereinafter, examples of embodiments will be described below with reference to the accompanying drawings through various examples of the embodiments.

Examples of embodiments may provide a test circuit block that may be capable of verifying a core circuit block before stacking a memory cell array.

Examples of embodiments may also provide a variable resistance memory device including the above-mentioned test circuit block.

Examples of embodiments may still also provide a method of forming the above-mentioned variable resistance memory device.

Figure 1:
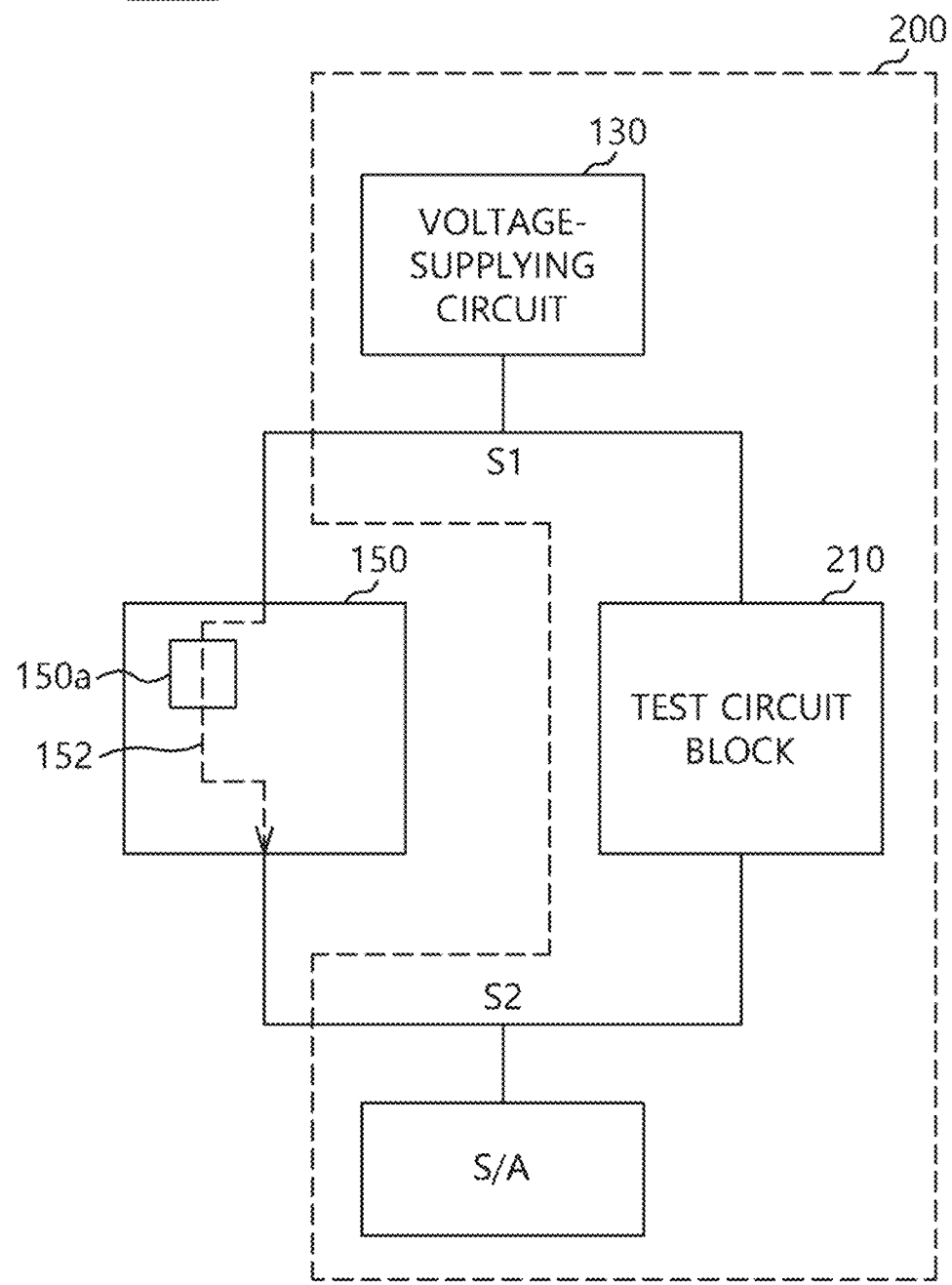
FIG. 1 is a block diagram illustrating a variable resistance memory device in accordance with examples of embodiments.

FIG. 1 is a block diagram illustrating a variable resistance memory device in accordance an embodiment.

Referring to FIG. 1, a variable resistance memory device 100 may include a core circuit 200 and a memory cell array 150.

The core circuit 200 may include a first signal line S1, a second signal line S2 and a test circuit block 210 selectively connected between the first signal line S1 and the second signal line S2.

The memory cell array 150 may be directly or indirectly connected with the first signal line S1 and the second signal line S2.

Figure 2:
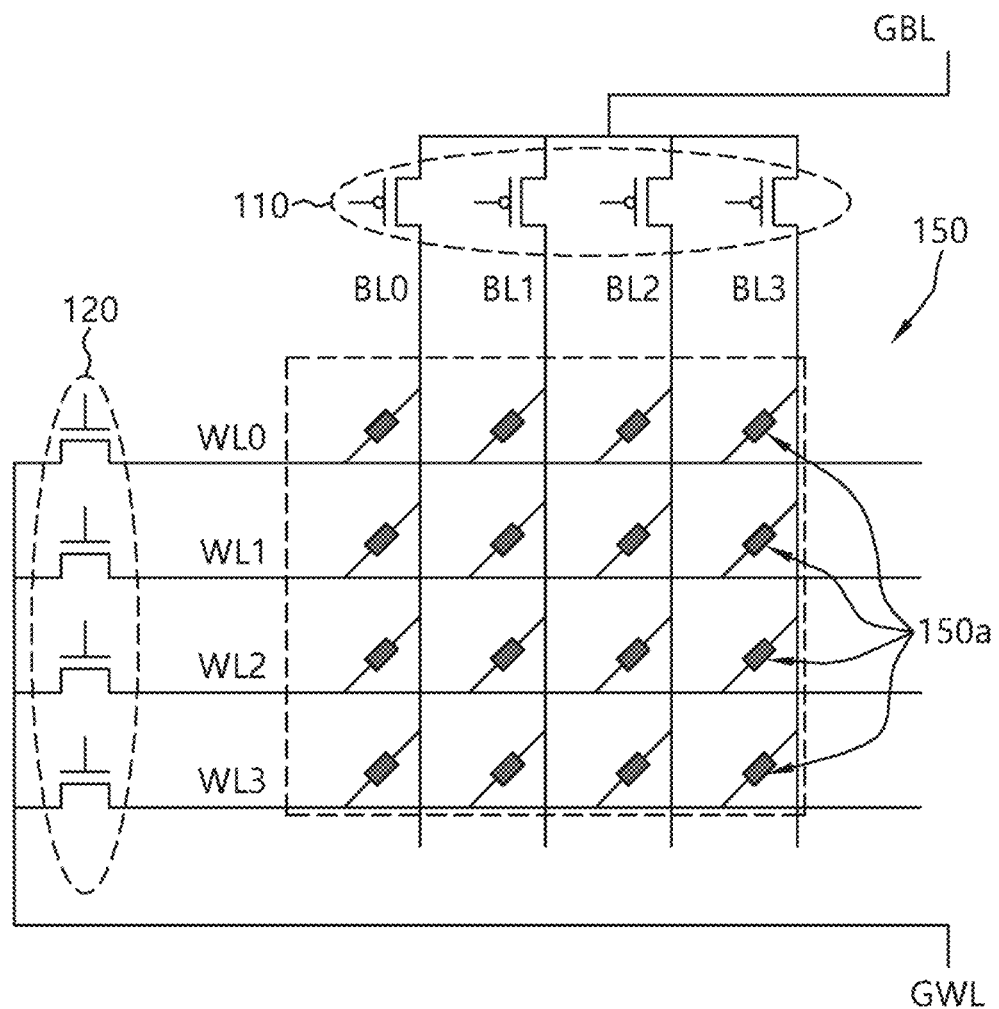
FIG. 2 is a circuit diagram illustrating a memory cell array of a variable resistance memory device in accordance with examples of embodiments.

FIG. 2 is a circuit diagram illustrating a memory cell array of a variable resistance memory device in accordance with an example of an embodiment.

Referring to FIG. 2, the memory cell array 150 may include a plurality of memory cells 150a. Each of the memory cells 150a may include a material having a variable resistance in accordance an applied current. For example, the memory cell 150a may include a resistive memory cell (not illustrated) having a phase changeable layer such as a chalcogenide compound and a selecting device (not illustrated). The phase changeable layer may have a resistance value corresponding to a logic value of a memory cell 150a. Further, the selecting device may include another phase changeable layer such as an Ovonic threshold switch (OTS). The memory cells 150a may be positioned at intersected points between a plurality of bit lines BL0~BL3 branched from a global bit line GBL, and a plurality of word lines WL0~WL3 branched from a global word line GWL, respectively. For example, the first signal line S1 of FIG. 1 may correspond to the global bit line GBL. The second signal line S2 of FIG. 1 may correspond to the global word line GWL. A normal cell path 152 may occur from the bit line BL branched from the global bit line GBL to the word line WL branched from the global word line GWL though a selected memory cell 150a.

A bit line selection switch 110 may be connected between the global bit line GBL and the bit lines BL0~BL3. The bit line selection switch 110 may be configured to select any one of the bit lines BL0~BL3. For example, the bit line selection switch 110 may include PMOS transistors. Further, a word line selection switch 120 may be connected between the global word line GWL and the word lines WL0~WL3. The word line selection switch 120 may be configured to select any one of the word lines WL0~WL3. For example, the word line selection switch 120 may include NMOS transistors.

Referring back to FIG. 1, a voltage supplying circuit 130 may be connected to the first signal line S1, for example, the global bit line GBL. A sense amplifier S/A may be connected to an output terminal of the test circuit block 210, for example, the second signal line S2 to test characteristics of current transmission in the test circuit block 210.

In an embodiment, the sense amplifier S/A may be connected to the second signal line S2 as the output terminal of the test circuit block 210 to check the characteristics of the current transmission in the test circuit block 210. Alternatively, other sense amplifiers (not illustrated) having functions substantially the same as those of the sense amplifier S/A may be connected with the bit lines BL0~BL3 of the memory cell array 150.

Figure 3:
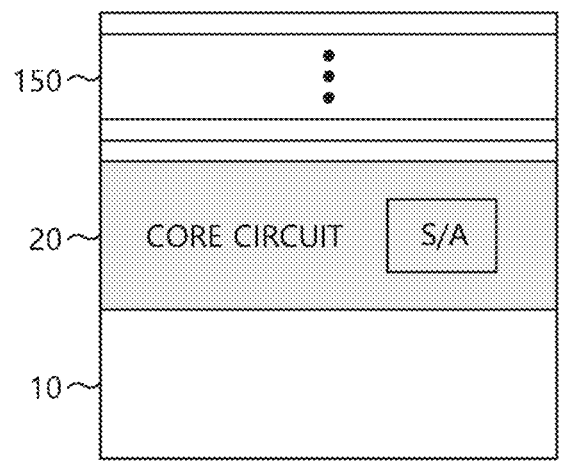
FIG. 3 is a cross-sectional view illustrating a variable resistance memory device in accordance with examples of embodiments.

FIG. 3 is a cross-sectional view illustrating a variable resistance memory device in accordance with an embodiment.

Referring to FIG. 3, a general resistive memory device may include a plurality of phase changeable memory cell arrays 150 and a core circuit 20. The core circuit 20 may include the sense amplifier S/A and a control circuit (not illustrated) for controlling the memory cell array 150 The core circuit 20 may be positioned between a semiconductor substrate 10 and the memory cell array 150. That is, the core circuit 20 may be formed on the semiconductor substrate 10. The phase changeable memory cell array 150 may be formed on the core circuit 20.

Because the memory cell array 150 may be located over the core circuit 20, operations for verifying the core circuit 20 may be performed after forming the memory cell array 150. Further, when an error is detected in the core circuit 20 after forming the memory cell array 150, it may be very difficult to revise the core circuit 20 because the core circuit 20 may be covered by the memory cell array 150.

According to an embodiment, in order to solve the structural problems of the core circuit 20 and the memory cell array 150, the test circuit block 210 may be installed in the core circuit 20 to verify the functions of the sense amplifier S/A.

Figure 4:
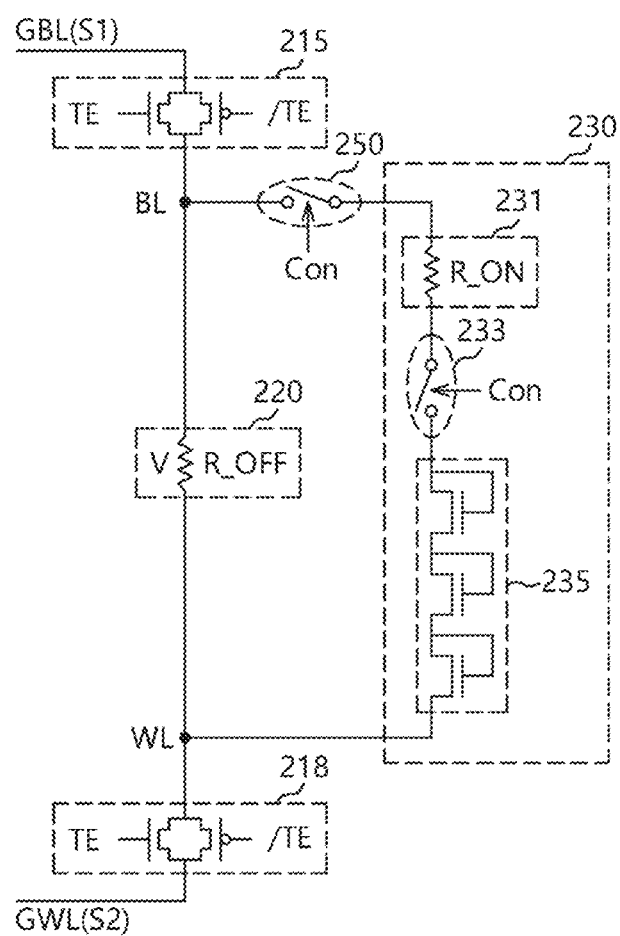
FIG. 4 is a circuit diagram illustrating a test circuit block in accordance with examples of embodiments.
Figure 5:
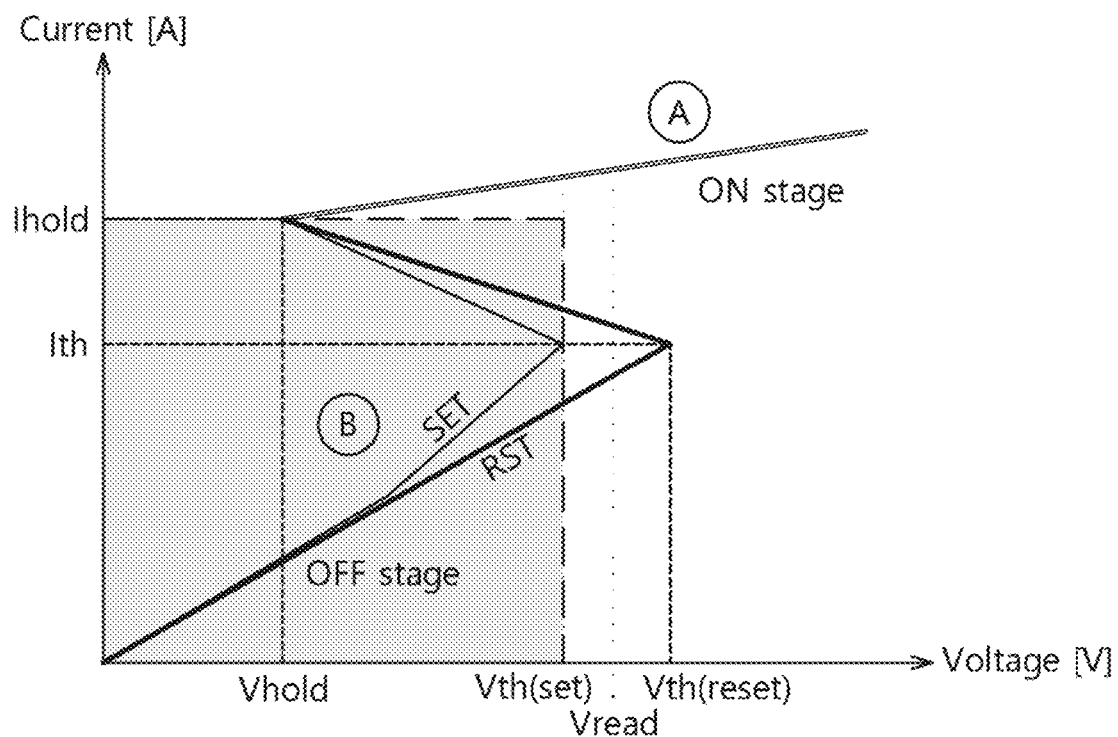
FIG. 5 is a graph showing current-voltage relations of a phase changeable memory device in accordance with examples of embodiments.

FIG. 4 is a circuit diagram illustrating a test circuit block in accordance with an embodiment, and FIG. 5 is a graph illustrating current-voltage relations of a phase changeable memory device in accordance with an embodiment.

Referring to FIG. 4, the test circuit block 210 may include the first signal line S1, the second signal line S2, a first enabling circuit 215, a second enabling circuit 218, a high resistive path unit 220, a low resistive path unit 230, a switching circuit 250. In an embodiment, the test circuit block 210 may be included in the core circuit 20.

The first enabling circuit 215 may be connected between the first signal line S1 and the high resistive path unit 220. The first enabling circuit 215 may include a transfer gate. The first enabling circuit 215 may be driven in response to a test mode signal TE and /TE.

The first signal line S1 may correspond to any one of the global bit lines GBL connected with the memory cell array 150. A signal line connected to an output terminal of the first enabling circuit 215 may correspond to the bit line BL to be tested.

The second enabling circuit 218 may be connected between the second signal line S2 and the high resistive path unit 220. The second enabling circuit 218 may include a transfer gate. The second enabling circuit 218 may be also driven in response to the test mode signal TE and /TE.

The second signal line S2 may correspond to any one of the global word lines GWL connected with the memory cell array 150. A signal line connected to an input or output terminal of the second enabling circuit 218 may correspond to the word line WL to be tested.

The test mode signal TE for driving the first and second enabling circuits 215 and 218 may be a signal enabled when verifying the core circuit 20. The test mode signal TE may be generated in the core circuit 20 of the variable resistance memory device 100. Alternatively, the test mode signal TE may be a signal inputted from a controller (not illustrated).

The high resistive path unit 220 may be connected between the first signal line S1 and the second signal line S2. When the first and second enabling circuits 215 and 218 are operated by enabling the test mode signal TE, a path between the bit line BL and the word line WL are electrically connected through the high resistive path unit 220. In an embodiment, the bit line BL may be a test bit line and the word line WL may be a test word line. For example, the high resistive path unit 220 may include an off-resistance Roff. The off-resistance Roff may correspond to a resistance value of a selected memory cell 150a which is not turned on. The selected memory cell 150a may correspond to a memory cell connected with a selected bit line BL or a selected word line WL. At that time, the selective bit line BL may receive a hold voltage. The off-resistance Roff may further include a resistance value reflecting a leakage component to the resistance value of the selected memory cell MC. For example, the high resistive path unit 220 may have a resistance lower than a total resistance of a reset resistance Rreset and a leakage resistance Rleakage connected in parallel.

$$\text{Roff} < (\text{Rreset} \times \text{Rleakage})/(\text{Rreset} + \text{Rleakage}) \qquad \text{Formula 1}$$

Here, the reset resistance Rreset may be applied to the high resistive path unit 220 because the reset resistance Rreset may be higher than a set resistance Rset.

FIG. 5 is a graph showing current-voltage relations of a phase changeable memory device in accordance with an embodiment.

Referring to FIG. 5, when a bit line voltage VBL is no less than a threshold voltage Vth(set) and/or Vth(reset) for performing set and reset operations, the memory cell may be turned-on.

For example, the threshold voltage Vth(set) for writing data of '0' may be used as the threshold voltage. In the graph of FIG. 5, a read voltage Vread may be used for distinguishing the set state and the reset state from each other. Ith in FIG. 5 may designate a threshold current corresponding to the threshold voltages Vth(set) and Vth(reset).

Generally, the phase changeable memory cell may generate a high current of no less than a holding current Ihold under a condition that a voltage may be higher than the set threshold voltage Vth(set) and the reset threshold voltage Vth(reset). Further, when a selected memory cell starts to be turned-on, the memory cell may have a snapback characteristic for generating the high current.

Therefore, an operation region of the memory cell of the phase changeable memory device may be divided having a section of no less than the threshold voltage Vth(set) and no less than the holding current Ihold as an on-state (A) (ON stage), and a section of no more than the threshold voltage Vth(set) and a section of no more than the holding current Ihold as an off-state (B) (OFF stage).

The high resistive path unit 220 may be designed to model a resistance of the off-state (B) in FIG. 5. That is, the high resistive path unit 220 may be designed to represent a resistance value corresponding to the off-state (B), i.e., a slope of the current-voltage graph from 0 voltage to the threshold voltage Vth(set) before the memory cell is turned on.

The low resistive path unit 230 may be connected with the high resistive path unit 220 in parallel. The low resistive path unit 230 may be connected between the bit line BL and the word line WL in accordance with operations of the switching circuit 250. The low resistive path unit 230 may include an on resistance Ron 231, a cell switching circuit 233 and a holding voltage-generating circuit 235. The on-resistance Ron 231 may be designed to have a resistance value corresponding to a slope of the on-state (A) in FIG. 5. The on-resistance 231 may vary according to in accordance with voltage level applied from the voltage supplying circuit 130 of the FIG. 1.

The cell switching circuit 233 may be turned-on by a control signal Con. Alternatively, the cell switching circuit 233 may be omitted.

The holding voltage-generating circuit 235 may be configured to generate the holding voltage Vhold corresponding to a minimum voltage for maintaining a turn-on of the phase changeable memory cell. The holding voltage-generating circuit 235 may include a plurality of diodes connected in series. The diodes may have a MOS transistor structure including a gate and a drain coupled in common.

The switching circuit 250 may be selectively driven by the control signal Con to drive the low resistive path unit 230. The switching circuit 250 and the cell switching circuit 233 may be simultaneously driven.

Figure 6:
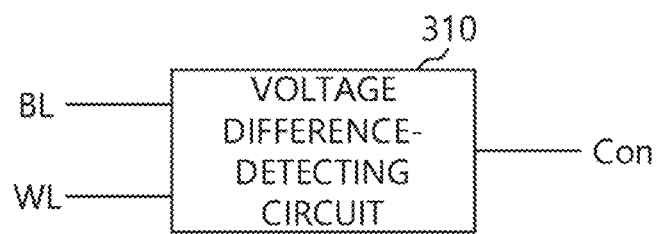
FIG. 6 is a circuit diagram illustrating a control signal-generating circuit for generating the control of FIG. 4.

FIG. 6 is a circuit diagram illustrating a control signal-generating circuit for generating the control of FIG. 4.

Referring to FIG. 6, a control signal-generating circuit 300a may include a voltage difference-detecting circuit 310. The voltage difference-detecting circuit 310 may be configured to receive voltages of the bit line BL and the word line WL, as input signals. When a voltage difference of the bit line BL and the word line WL is no less than the threshold voltage, for example, Vth(set), the voltage difference-detecting circuit 310 may determine the memory cell to be turned-on to generate the control signal Con.

For example, when the voltage difference between the bit line BL and the word line WL is no more than the threshold voltage Vth(set), the voltage difference-detecting circuit 310 does not generate the control signal con. Thus, when the test mode signal TE is enabled, the switching circuit 250 and the cell switching circuit 233 of the test circuit block 210 may be turned-off so that a current flowing from the bit line BL to the word line WL may be transmitted through only the high resistive path unit 220 configured to reflect the resistance of the off-state.

In contrast, when the voltage difference between the bit line BL and the word line WL is no less than the threshold voltage Vth(set), the word line WL may be selected and the voltage may be applied to the bit line BL. In this case, the voltage difference-detecting circuit 310 may determine the phase changeable memory cell to be driven to output the control signal Con.

When the control signal Con is generated under a condition that the test mode signal TE is enabled, the switching circuit 250 and the cell switching circuit 233 may be turned-on. Thus, a current applied to the bit line BL may be transmitted through the low resistive path unit 230 configured to reflect the resistance of the on-state.

Although the high resistive path unit 220 and the low resistive path unit 230 are simultaneously connected between the bit line BL and the word line WL, most of the current flowing through the bit line BL may be transmitted through the low resistive path unit 230 having the relatively low resistance.

Figure 7:
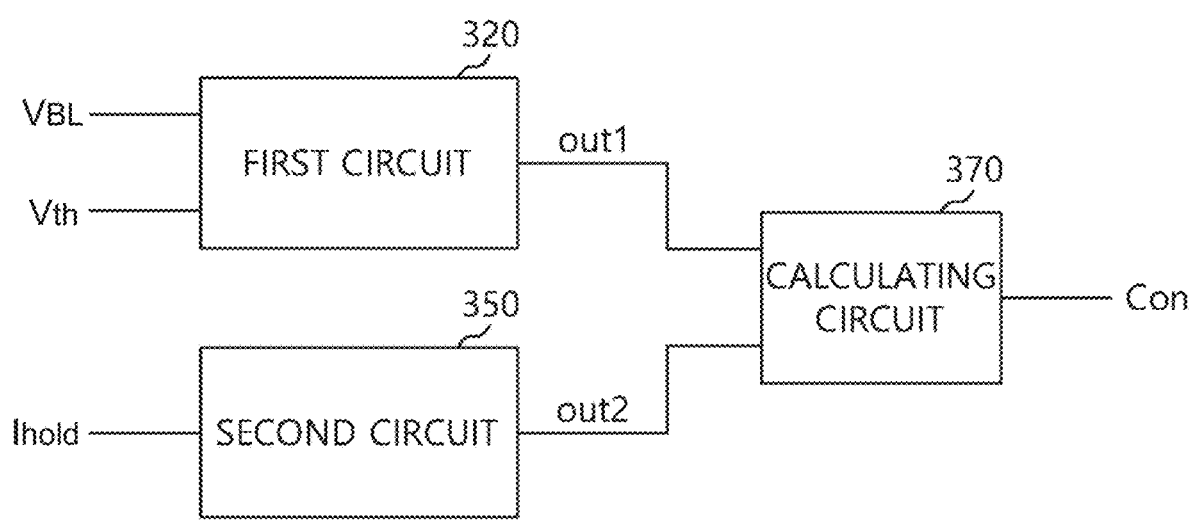
FIG. 7 is a block diagram illustrating a control signal-generating circuit in accordance with examples of embodiments.
Figure 8:
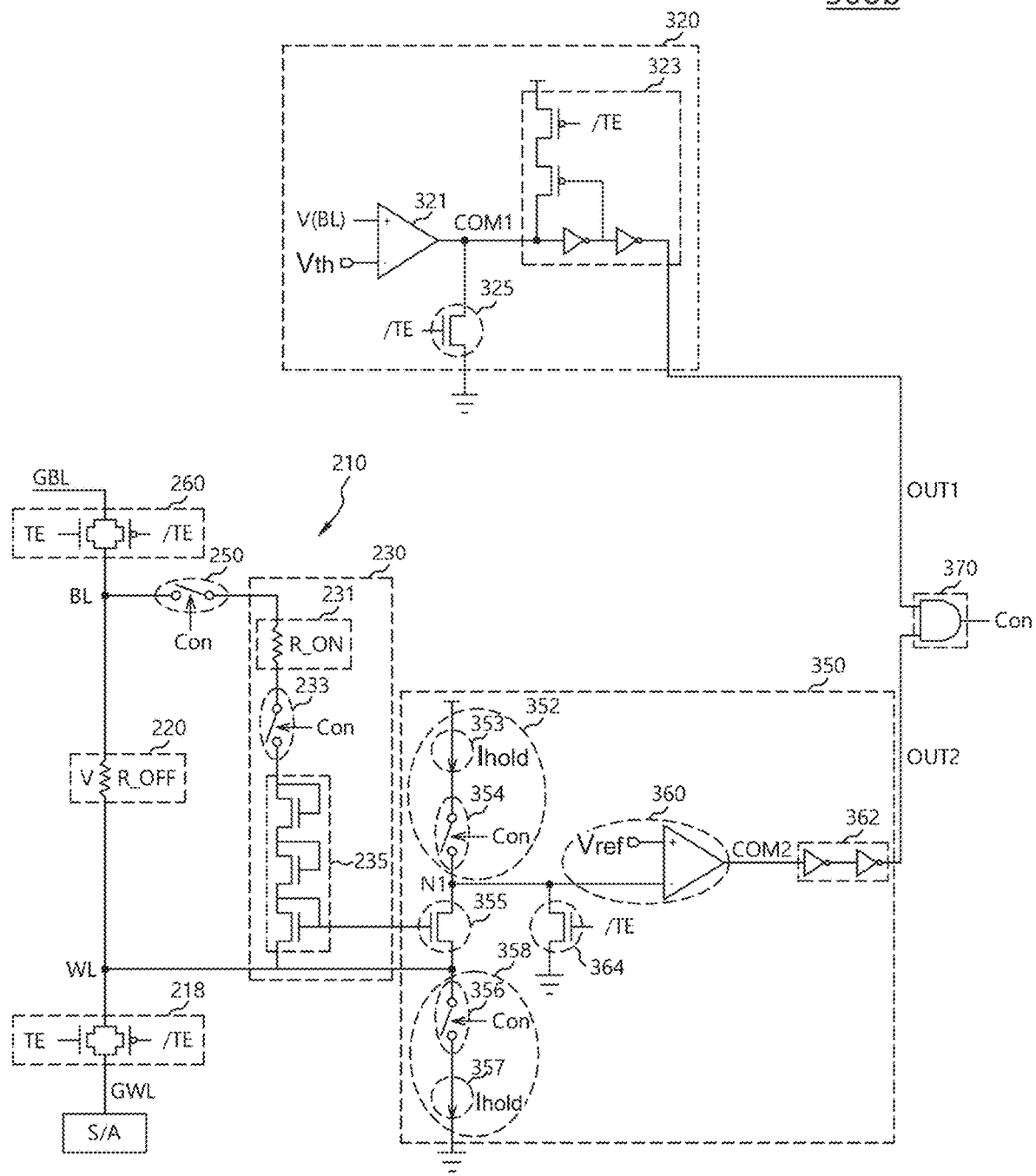
FIG. 8 is a circuit diagram illustrating a control signal circuit in accordance with examples of embodiments.

FIG. 7 is a block diagram illustrating a control signal-generating circuit in accordance with an embodiment, and FIG. 8 is a circuit diagram illustrating a control signal circuit in accordance with an embodiment.

Referring to FIG. 7, a control signal-generating circuit 300b may include a first circuit 320, a second circuit 350 and a calculating circuit 370.

When the bit line voltage VBL is no less than the threshold voltage Vth(set), the first circuit 320 is configured to generate a first output signal out1 enabled, for example, to a high level.

As illustrated in FIG. 8, the first circuit 320 may include a first comparing circuit 321, a buffering circuit 323 and a first discharging circuit 325.

The first comparing circuit 321 may be configured to compare the bit line voltage VBL with the threshold voltage Vth(set). When the bit line voltage VBL is higher than the threshold voltage Vth(set), the first comparing circuit 321 may output a comparing signal com1. The first comparing circuit 321 may correspond to general comparator, such as, for example, a differential operator.

The buffering circuit 323 may buffer the comparing signal com1 in response to an inverted test mode signal /TE as the first output signal out1. The buffering circuit 323 may include a PMOS transistor and inverters driven in response to the inverted test mode signal /TE, however, the buffering circuit 323 is not restricted to a specific structure.

The first discharging circuit 325 may be configured to discharge an output node of the comparing circuit 321 in a non-test mode. The first discharging circuit 325 may include an NMOS transistor driven in response to the inverted test mode signal /TE.

Referring FIGS. 7 and 8, when the current flowing through the low resistive path unit 230 is no less than the holding current Ihold, the second circuit 350 may generate a second output signal out2 enabled to, for example, a high level. That is, when the current flowing through the low resistive path unit 230 is no more than the holding current Ihold, the second circuit 350 may generate the second output signal out2 disabled to a low level.

The second circuit 350 may include a first current-supplying circuit 352, a current-detecting circuit 355, a second current-supplying circuit 358, a second comparing circuit 360, a buffering circuit 362 and a second discharging circuit 364.

The first current-supplying circuit 352 may include a first hold current source 353 and a first switch 354. The first switch 354 may be turned-on in response to the control signal Con.

The current-detecting circuit 355 may be configured to detect a current amount flowing through the holding voltage-generating circuit 235 of the low resistive path unit 230. The current-detecting circuit 355 may include an NMOS transistor driven in response to the output signal of the holding voltage-generating circuit 235.

The second current-supplying circuit 358 may receive the current amount provided from the first current-supplying circuit 352. The second current-supplying circuit 358 may output the received current amount to a ground terminal. The second current-supplying circuit 358 may include a second switch 356 and a second holding current source 357. The first and second holding current sources 353 and 357 may transfer as the hold current Ihold.

The second comparing circuit 360 may compare a reference voltage Vref with a voltage of a connection node between the first current-supplying circuit 352 and the current-detecting circuit 355 to generate a comparing signal com2. The reference voltage Vref may correspond to a voltage level corresponding to the holding current Ihold.

The buffering circuit 362 may include a plurality of inverters. The buffering circuit 362 may buffer the comparing signal com2 to output the buffered signal as the second output signal out2.

The second discharging circuit 364 may be configured to discharge the voltage of the connection node N1 in the non-test mode. The second discharging circuit 364 may include an NMOS transistor driven in response to the inverted test mode signal /TE.

The second circuit 350 may be driven as follows.

When the current amount flowing through the holding voltage-generating circuit 235 of the low resistive path unit 230 is no less than the holding current Ihold, a driving force of the current-detecting circuit 355 may be increased because a gate level of the current-detecting circuit 355 composed of the NMOS transistor becomes higher than levels of source and drain in the current-detecting circuit 355. Thus, most of the currents generated from the first current-supplying circuit 352 may be transmitted to the second current-supplying circuit 358 to decrease the voltage level of the connection node N1. Therefore, the second comparing circuit 360 may output the second comparing signal com2 enabled to the high level. The second circuit 350 may generate a stabilized second output signal out2 having the high level.

In contrast, when the current amount flowing through the holding voltage-generating circuit 235 of the low resistive path unit 230 is no more than the holding current Ihold, most of the currents generated from the first current-supplying circuit 352 may remain in the connection node N1 to increase the voltage level of the connection node N1. Therefore, the voltage level of the connection node N1 becomes higher than the reference voltage Vref. Thus, the second comparing circuit 360 may output the second comparing signal com2 disabled to the low level. The second circuit 350 may generate the second output signal out2 having the low level.

The calculating circuit 370 may receive the first output signal out1 and the second output signal out2. The calculating circuit 370 may generate the control signal Con for turning-on the switching circuit 250. The calculating circuit 370 may include a logic circuit configured to perform AND calculations.

That is, when the bit line voltage VBL applied to the test circuit block 210 is no less than the threshold voltage Vth(set) and the applied current is no less than the holding current Ihold in "A" region of FIG. 5, the control signal-generating circuit 300b may output the control signal Con for turning-on the switching circuit 250.

In contrast, when the bit line voltage VBL applied to the test circuit block 210 is no more than the threshold voltage Vth(set), or the applied current is no more than the holding current Ihold in "B" region of FIG. 5, the control signal-generating circuit 300b does not generate the control signal Con to prevent the operations of the switching circuit 250.

The test circuit block of this example of an embodiment may be driven as follows.

The core circuit 20 including the test circuit block 210 and the sense amplifier S/A may be formed on the semiconductor substrate 10. Before stacking the memory cell array 150 on the core circuit 20, the test circuit block 210 may be driven to detect the characteristics of the sense amplifier S/A.

The switching circuit 250 may be selectively driven in accordance with the voltage difference ΔV or the voltage level VBL of the bit line BL under the condition that the test mode signal TE and /TE are enabled.

For example, when the voltage difference ΔV between the bit line BL and the word line WL is lower than the threshold voltage Vth(set), the switching circuit 250 is turned-off. Thus, only the high resistive path unit 220 may be connected between the bit line BL and the word line WL. The sense amplifier S/A may sense the off-resistance value of the selected memory cell through the resistance value of the high resistive path unit 220.

In contrast, when the voltage difference ΔV between the bit line BL and the word line WL is higher than the threshold voltage Vth(set), the switching circuit 250 and the switching circuits 233, 354, 356 may be turned-on. Thus, the high resistive path unit 220 and the low resistive path unit 230 may be simultaneously connected between the bit line BL and the word line WL. Because the effective resistance of the low resistive path unit 230 may be greatly lower than the effective resistance of the high resistive path unit 220, most of the current transmitted from the bit line BL may be transmitted to the word line WL through the low resistive path unit 230.

When the current flowing through the low resistive path unit 230 is no more than the holding current Ihold under the condition that the voltage level VBL of the bit line BL is no less than the threshold voltage Vth, the switching circuit 250 and the switching circuits 233, 354 and 356 may be turned-off. Thus, the sense amplifier S/A may sense the resistance values corresponding to the set voltage and the reset voltage at a level of a threshold current Ith to verity whether a reading operation was accurately performed or not.

A writing verifying of the sense amplifier S/A may be performed using the current amount or the resistance in accordance with the bit line voltage VBL. Thus, the writing verifying of the sense amplifier S/A may be performed by the operations of the first circuit 320. Therefore, when the writing verifying of the sense amplifier S/A is performed, the first output signal out1 of the first circuit 320 may use as the control signal Con.

The core circuit 20 such as the sense amplifier S/A may be verified using the test circuit block 210 before forming the memory cell array 150. Therefore, when an error is generated in the core circuit 20, the core circuit 20 may be corrected with design changes made relating to the sense amplifier S/A.

FIG. 9 is a flow chart illustrating a method of forming a variable resistance memory device in accordance with an embodiment.

Referring to FIG. 9, in step S1, the core circuit 20 including the sense amplifier S/A and the test circuit block 210 may be formed on the semiconductor substrate 10.

In step S2, the core circuit 20, i.e., the sense amplifier S/A may be verified using the test circuit block 210. The operations of the test circuit block 210 in FIGS. 1 to 8 may be performed to identify the normal structure of the sense amplifier S/A.

In step S3, whether sensed results of the sense amplifier S/A may have an error or not may be identified.

When an error is generated in the sense amplifier S/A, in step S4, the sense amplifier S/A is corrected through the design changes. The core circuit 20 including the sense amplifier S/A may then be re-verified.

When an error does not exist in the core circuit 20, in step S5, the memory cell array 150 may be formed on the core circuit 20 including the sensed amplifier S/A.

According to an embodiment, the test circuit block including the resistances corresponding to the on/off resistances of the memory cell, may be formed in the core circuit. Before stacking the memory cell array on the core circuit, the core circuit, particularly the sense amplifier may be verified using the test circuit block. When the error is generated in the sense amplifier by the verification, the sense amplifier may be revised before stacking the memory cell array. The memory cell array may then be stacked on the corrected core circuit. Therefore, a time for verifying the core circuit may be reduced. Further, the core circuit having the error may be corrected.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A test circuit block included in a core circuit, for testing the core circuit, comprising:
   a first signal line;
   a second signal line;
   a high resistive path unit connected between the first signal line and the second signal line; and
   a low resistive path unit having a resistance lower than a resistance of the high resistive path unit, the low resistive path unit selectively connected with the high resistive path unit in parallel, between the first signal line and the second signal line,
   wherein the high resistive path unit comprises an off-resistance value of a selected variable resistance memory cell before turning-on and a resistance value in accordance with a leakage current of the selected variable resistance memory cell.

2. The test circuit block of claim 1, wherein the low resistive path unit comprises an on-resistance value of a selected variable resistance memory cell.

3. The test circuit block of claim 2, wherein the low resistive path unit comprises a holding voltage-generating circuit configured to provide a minimum voltage for maintaining a turn-on state of the variable resistance memory cell after a snapback of the variable resistance memory cell.

4. The test circuit block of claim 3, wherein the holding voltage-generating circuit comprises a plurality of diodes connected in series.

5. The test circuit block of claim 3, wherein the low resistive path unit comprises:
   an on resistance coupled between the first signal line and the holding voltage-generating circuit, and configured to provide the on-resistance value of the selected variable resistance memory cell; and
   a cell switching circuit configured to couple the on resistance to the holding voltage-generating circuit.

6. The test circuit block of claim 1, further comprising:
   a switching circuit coupled between the high resistive path unit and the low resistive path unit to selectively connect the low resistive path unit with the high resistive path unit,
   wherein the switching circuit is selectively driven in accordance with a voltage difference between the first signal line and the second signal line.

7. The test circuit block of claim 1, further comprising:
   a switching circuit coupled between the high resistive path unit and the low resistive path unit to selectively connect the low resistive path unit with the high resistive path unit,
   wherein the switching circuit is turned-on when a voltage of the first signal line is no less than a threshold voltage.

8. The test circuit block of claim 7, wherein the switching circuit is turned-off when a current flowing through the low resistive path unit is no more than a holding current.

9. The test circuit block of claim 1, wherein the first signal line comprises a bit line and the second signal line comprises a word line.

10. The test circuit block of claim 1, further comprising:
    a first enabling circuit connected between the first signal line and the high resistive path unit; and
    a second enabling circuit connected between the high resistive path unit and the second signal line,
    wherein the first and second enabling circuits are selectively driven in response to a test mode signal.

11. A variable resistance memory device comprising:
    a semiconductor substrate;
    a core circuit block including a sense amplifier and a test circuit block positioned over the semiconductor substrate; and
    a memory cell array stacked on the core circuit block, the memory cell array including a plurality of bit lines, a plurality of word lines and resistive memory cells connected between the bit lines and the word lines, wherein the test circuit block comprises:
a test bit line connected with any one of the bit lines;
a test word line connected with any one of the word lines;
a high resistive path unit connected between the any one of the bit lines and the anyone of the word lines when a test mode signal is enabled; and
a low resistive path unit selectively connected in parallel with the high resistive path unit between the test bit line and the test word line.

12. The variable resistance memory device of claim 11, wherein the high resistive path unit comprises an off-resistance of a selected memory cell among the memory cells and a leakage voltage of the selected memory cell.

13. The variable resistance memory device of claim 12, wherein the low resistive path unit comprises a cell switching circuit configured to couple the on resistance to the holding voltage-generating circuit based on a control signal.

14. The variable resistance memory device of claim 11, wherein the low resistive path unit comprises an on-resistance and a holding voltage-generating circuit connected to the on-resistance, and the on-resistance has a resistance value corresponding to an on-resistance value of a selected memory cell of the memory cell array.

15. The variable resistance memory device of claim 14, wherein the holding voltage-generating circuit comprises a plurality of diodes serially connected with each other.

16. The variable resistance memory device of claim 11, further comprising:
a switching circuit installed between the high resistive path unit and the low resistive path unit to selectively connect the low resistive path unit with the high resistive path unit based on a control signal; and
a control signal-generating circuit for generating the control signal, the control signal-generating circuit configured to enable the control signal when a voltage difference between the test bit line and the test word line is no less than a threshold voltage.

17. The variable resistance memory device of claim 11, further comprising:
a switching circuit installed between the high resistive path unit and the low resistive path unit to selectively connect the low resistive path unit with the high resistive path unit based on a control signal; and
a control signal-generating circuit for generating the control signal, the control signal-generating circuit configured to output the control signal when a voltage of the bit line is no less than a threshold voltage.

18. The variable resistance memory device of claim 11, further comprising:
a switching circuit installed between the high resistive path unit and the low resistive path unit to selectively connect the low resistive path unit with the high resistive path unit based on a control signal; and
a control signal-generating circuit for generating the control signal,
wherein the control signal-generating circuit comprises:
a first circuit configured to generate a first output signal enabled when a voltage of the bit line is no less than a threshold voltage;
a second circuit configured to generate a second output signal enabled when an output current of the low resistive path unit is no less than a holding current; and
a calculating circuit configured to enable the control signal when the first and second output signals are enabled.

19. A method of forming a variable resistance memory device, the method comprising:
forming a core circuit on a semiconductor substrate, the core circuit including a test circuit block formed by modeling a memory cell;
verifying the core circuit using the test circuit block;
correcting the core circuit when an error is generated in the core circuit; and
forming a memory cell array including a plurality of memory cells on the core circuit.

* * * * *